(12) United States Patent
Shin et al.

(10) Patent No.: US 11,659,653 B2
(45) Date of Patent: May 23, 2023

(54) ELECTRONIC DEVICE HAVING WINDOW AND ELECTRONIC MODULE DISPOSED UNDER AND SPACED APART FROM WINDOW

(71) Applicant: Samsung Display Co., Ltd., Yongin-si (KR)

(72) Inventors: Jaiku Shin, Hwaseong-si (KR); Dongjin Park, Seongnam-si (KR); Dongwoo Seo, Suwon-si (KR); Sung Chui Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 24 days.

(21) Appl. No.: 17/070,491

(22) Filed: Oct. 14, 2020

(65) Prior Publication Data

US 2021/0259102 A1 Aug. 19, 2021

(30) Foreign Application Priority Data

Feb. 14, 2020 (KR) .................. 10-2020-0018619
Apr. 24, 2020 (KR) .................. 10-2020-0050001

(51) Int. Cl.
| | | |
|---|---|---|
| *H05K 5/00* | (2006.01) | |
| *H05K 1/02* | (2006.01) | |
| *G02F 1/1333* | (2006.01) | |

(52) U.S. Cl.
CPC ..... *H05K 1/0281* (2013.01); *G02F 1/133305* (2013.01); *G02F 1/133308* (2013.01); *H05K 5/0017* (2013.01); *G02F 1/133311* (2021.01)

(58) Field of Classification Search
CPC ................ H05K 1/0281; H05K 5/0017; G02F 1/133305; G02F 1/133308; G02F 1/133311; H04M 2250/12; H04M 1/0214; H04M 1/0264; H04M 1/0266; H04M 1/0268;
(Continued)

(56) References Cited

U.S. PATENT DOCUMENTS

| 10,466,822 B2 | 11/2019 | Kim et al. |
| 10,476,013 B2 | 11/2019 | Shin et al. |
| 2017/0287992 A1 | 10/2017 | Kwak et al. |

(Continued)

FOREIGN PATENT DOCUMENTS

| CN | 110232866 | 9/2019 |
| JP | 2010-266777 | 11/2010 |

(Continued)

OTHER PUBLICATIONS

Extended European Search Report dated Jul. 9, 2021, in European Application No. 21156155.0.

*Primary Examiner* — Anthony Q Edwards
*Assistant Examiner* — Hung Q Dang
(74) *Attorney, Agent, or Firm* — H.C. Park & Associates, PLC

(57) ABSTRACT

An electronic device includes a window, a display panel disposed under the window, a cushion member disposed under the display panel, and a first electronic module disposed under the window and inserted into a first hole defined in the display panel and the cushion member. The first hole includes a first hole portion defined in the display panel, and a second hole portion defined in the cushion member. The second hole portion has a width greater than a width of the first hole portion.

17 Claims, 13 Drawing Sheets

(58) Field of Classification Search
CPC .... G06F 1/1637; G06F 1/1686; G06F 1/1652; G06F 1/1616
See application file for complete search history.

(56) References Cited

U.S. PATENT DOCUMENTS

| | | |
|---|---|---|
| 2017/0289324 A1 | 10/2017 | Yeo et al. |
| 2017/0344788 A1* | 11/2017 | Lee ..................... G06F 3/0412 |
| 2018/0375975 A1 | 12/2018 | Kikuchi |
| 2019/0245958 A1 | 8/2019 | Cheng |
| 2019/0302504 A1 | 10/2019 | Wang et al. |
| 2019/0306295 A1 | 10/2019 | Cheng |
| 2019/0355927 A1 | 11/2019 | Park |
| 2020/0045826 A1 | 2/2020 | Wang et al. |
| 2021/0259102 A1 | 8/2021 | Shin et al. |

FOREIGN PATENT DOCUMENTS

| | | |
|---|---|---|
| KR | 10-2018-0063633 | 6/2018 |
| KR | 10-2019-0115167 | 10/2019 |
| KR | 10-2019-0131154 | 11/2019 |
| KR | 10-2020-0014459 | 2/2020 |
| KR | 10-2021-0104516 | 8/2021 |

\* cited by examiner

ELECTRONIC DEVICE HAVING WINDOW AND ELECTRONIC MODULE DISPOSED UNDER AND SPACED APART FROM WINDOW

CROSS-REFERENCE TO RELATED APPLICATIONS

This application claims priority to and the benefit of Korean Patent Application No. 10-2020-0018619, filed Feb. 14, 2020, and Korean Patent Application No. 10-2020-0050001, filed Apr. 24, 2020, each of which is hereby incorporated by reference for all purposes as if fully set forth herein.

BACKGROUND

Field

Example embodiments generally relate to a foldable electronic device.

Discussion

An electronic device may include an active area activated in response to an electrical signal. The electronic device may sense an input applied thereto from the outside through the active area and may display (e.g., simultaneously display) various images to provide a user with information. As electronic devices having a variety of shapes are being developed, the active area may also be implemented in various shapes.

The above information disclosed in this section is only for understanding the background of the inventive concepts, and, therefore, may contain information that does not form prior art.

SUMMARY

Some example embodiments are capable of providing an electronic device having an active area that is expanded.

Some example embodiments are capable of providing an electronic device with improved product reliability.

Additional aspects will be set forth in the detailed description which follows, and, in part, will be apparent from the disclosure, or may be learned by practice of the inventive concepts.

According to some example embodiments, an electronic device includes a window, a display panel disposed under the window, a cushion member disposed under the display panel, and a first electronic module disposed under the window and inserted into a first hole defined in the display panel and the cushion member. The first hole includes a first hole portion defined in the display panel, and a second hole portion defined in the cushion member. The second hole portion has a width greater than a width of the first hole portion.

According to some example embodiments, an electronic device includes a window, a display panel disposed under the window, a cushion member disposed under the display panel, a first electronic module disposed under the window and inserted into a first hole defined in the display panel and the cushion member, and a second electronic module disposed under the window and inserted into a second hole defined in the cushion member. The first hole has a depth greater than a depth of the second hole.

According to some example embodiments, an electronic device includes a window, an anti-reflective member, a display panel, a cushion member, a first electronic module, and a second electronic module. The anti-reflective member is disposed under the window. The display panel is disposed under the anti-reflective member. The cushion member is disposed under the display panel. The first electronic module is disposed in a first hole defined through the cushion member, the display panel, and the anti-reflective member. The second electronic module is disposed in a second hole defined through the cushion member. When viewed in a plane, the second hole overlaps the display panel. The window, the anti-reflective member, the display panel, and the cushion member are configured to be folded and unfolded about a folding axis extending in a predetermined direction.

In some example embodiments, some electronic modules of the electronic modules may overlap an active area of the electronic device, and the other electronic modules of the electronic modules may be surrounded by the active area. Accordingly, it is not required to separately provide an area for the arrangement of the electronic modules in a peripheral area. As a result, a ratio of a size of the active area to a size of a front surface of the electronic device increases.

In some example embodiments, a distance between the electronic module inserted into the hole and the window may be greater than or equal to a predetermined distance. Thus, a probability that the window is damaged due to the electronic module is reduced.

In some example embodiments, at least one layer may be provided between the window and the hole. Accordingly, a probability that the window is damaged due to the electronic module inserted into the hole is reduced.

In some example embodiments, an impact absorbing layer may be disposed between the window and the hole, and a hard coating layer may be disposed at a lower surface of the impact absorbing layer. A portion of the hard coating layer may be exposed through the hole. As the hard coating layer may cover an uneven surface of the impact absorbing layer, a haze that may otherwise occur on the uneven surface is prevented.

In some example embodiments, the hole defined in the electronic device may include at least two hole portions. The at least two hole portions may be formed to have sizes different from each other taking into account a component tolerance, an installation tolerance, and a folding tolerance. Thus, an inner sidewall of the hole can be prevented from interfering with the electronic module inserted into the hole even though the hole is provided in the electronic device, which is foldable. In addition, a light blocking pattern may be disposed to correspond to a position of the hole and may be designed in consideration of the folding tolerance. Thus, a probability that the light blocking pattern covers the active area of the display panel or a field of view area of the electronic module can be reduced.

The foregoing general description and the following detailed description are example and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate example embodiments of the inventive concepts, and, together with the description, serve to explain principles of the inventive concepts. In the drawings.

DETAILED DESCRIPTION OF SOME EXAMPLE EMBODIMENTS

Figure 1A:
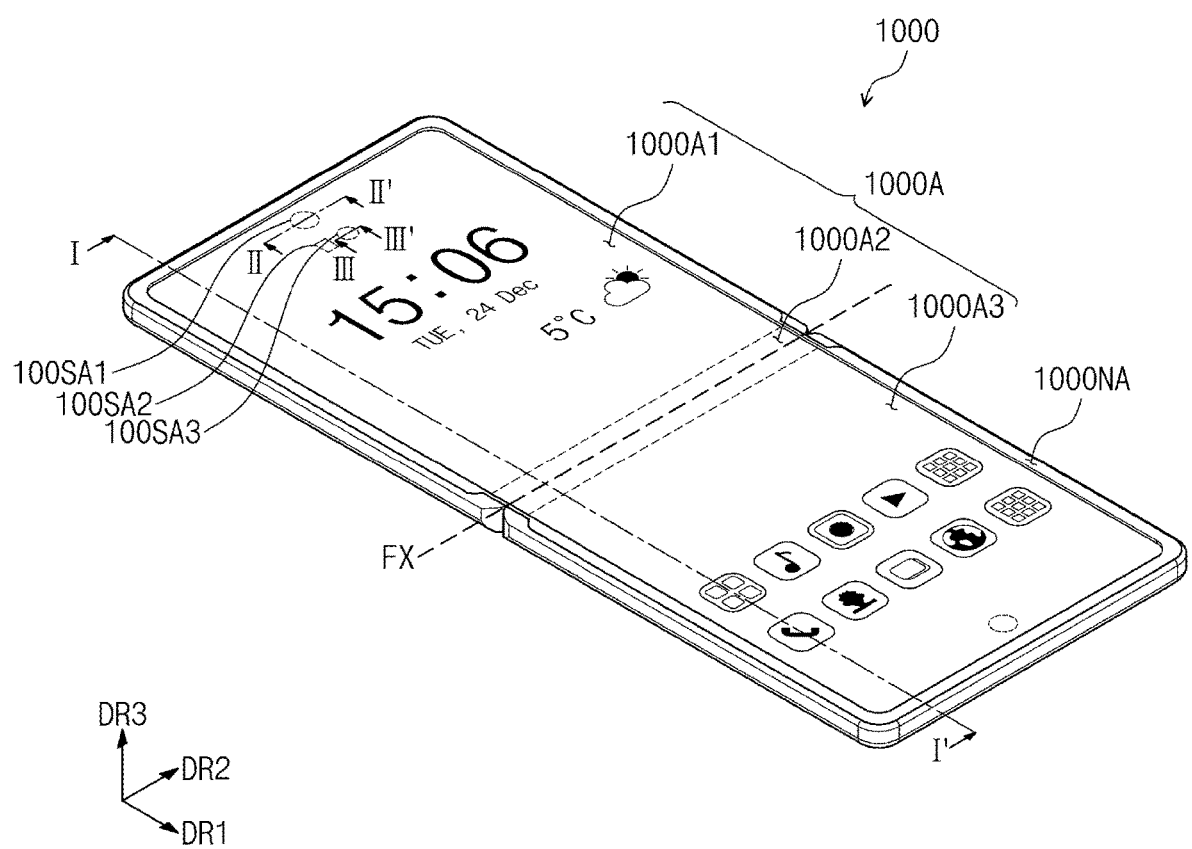
FIG. 1A is a perspective view showing an electronic device according to an example embodiment.

In the following description, for the purposes of explanation, numerous specific details are set forth in order to provide a thorough understanding of various example embodiments. As used herein, the terms "embodiments" and "implementations" are used interchangeably and are non-limiting examples employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some example embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional views, isometric views, perspective views, plan views, and/or exploded illustrations that are schematic illustrations of idealized example embodiments and/or intermediate structures. As such, variations from the shapes of the illustrations as a result of, for example, manufacturing techniques and/or tolerances, are to be expected. Thus, example embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the inventive concepts. Further, the blocks, units, and/or modules of some example embodiments may be physically combined into more complex blocks, units, and/or modules without departing from the inventive concepts.

Hereinafter, various example embodiments will be explained in detail with reference to the accompanying drawings.

Figure 1B:
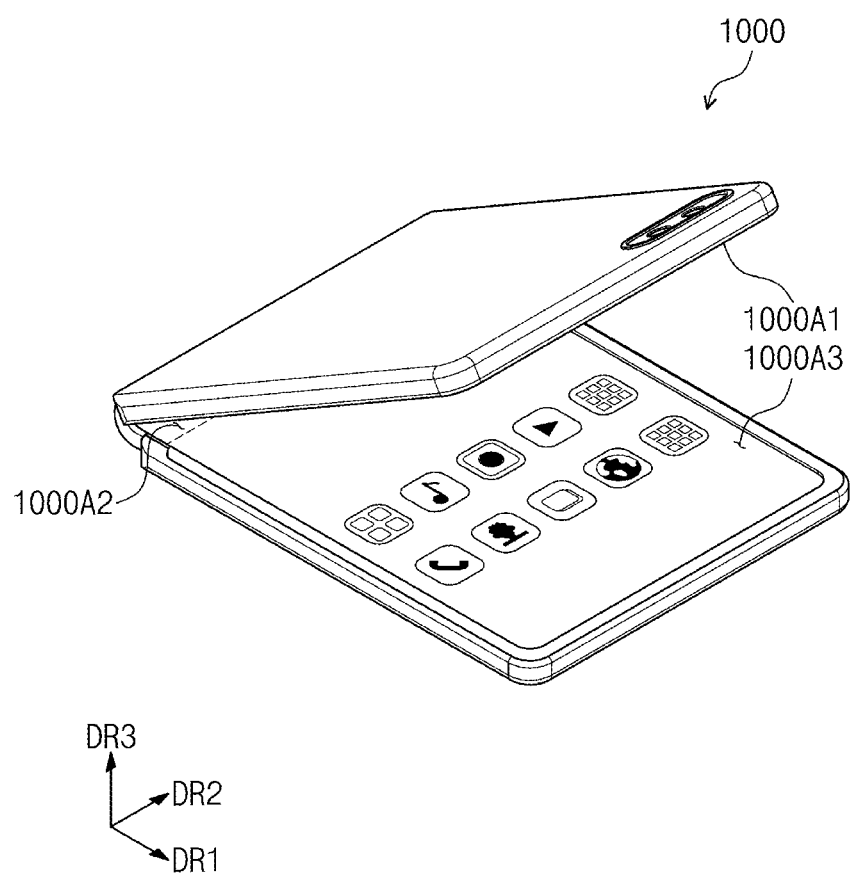
FIG. 1B is a perspective view showing an electronic device according to an example embodiment.

FIG. 1A is a perspective view showing an electronic device 1000 according to an example embodiment. FIG. 1B is a perspective view showing the electronic device 1000 according to an example embodiment. FIG. 1A shows an unfolded state of the electronic device 1000, and FIG. 1B shows a folded state of the electronic device 1000.

Referring to FIGS. 1A and 1B, the electronic device 1000 may be a device that is activated in response to electrical signals. The electronic device 1000 may be applied to (or in association with), for instance, a mobile phone, a tablet computer, a car navigation unit, a game unit, a wearable device, etc.; however, it is not limited thereto or thereby. FIG. 1A shows a mobile phone as a representative example of the electronic device 1000.

The electronic device 1000 may display an image through an active area 1000A. The active area 1000A may include a plane defined by a first direction DR1 and a second direction DR2 in a state in which the electronic device 1000 is unfolded. A thickness direction of the electronic device 1000 may be substantially parallel to a third direction DR3 crossing the first direction DR1 and the second direction DR2. Accordingly, front (or upper) and rear (or lower) surfaces of each member of the electronic device 1000 may be defined with respect to the third direction DR3.

The active area 1000A may include a first area 1000A1, a second area 1000A2, and a third area 1000A3. The second area 1000A2 may be bent about a folding axis FX extending in the second direction DR2. Accordingly, the first area 1000A1 and the third area 1000A3 may be referred to as non-folding areas, and the second area 1000A2 may be referred to as a folding area, but example embodiments are not limited thereto or thereby.

When the electronic device 1000 is folded, the first area 1000A1 and the third area 1000A3 may face each other. Accordingly, when the electronic device 1000 is fully folded, the active area 1000A may not be exposed to the outside, and this folding state may be referred to as an "in-folding" state or simply "in-folding." However, this is merely example, and an operation of the electronic device 1000 is not limited thereto or thereby.

As another example, when the electronic device 1000 according to an example embodiment is folded, the first area 1000A1 and the third area 1000A3 may face opposite directions. Accordingly, the active area 1000A may be exposed to the outside in this folding state, and may be referred to as an "out-folding" state or simply "out-folding."

The electronic device 1000 may perform only one of the in-folding and out-folding operations. In some embodiments, the electronic device 1000 may perform both the in-folding and the out-folding operations. In this case, the second area 1000A2 of the electronic device 1000 may be inwardly folded (in-folding) or outwardly folded (out-folding). As another example, a portion of the electronic device 1000 may be inwardly folded (in-folding), and the other portion of the electronic device 1000 may be outwardly folded (out-folding).

FIGS. 1A and 1B show one folding area and two non-folding areas as a representative example; however, the number of the folding areas and the number of the non-folding areas is not limited thereto or thereby. For example, the electronic device 1000 may include three or more non-folding areas and a plurality of folding areas disposed between the non-folding areas adjacent to each other.

FIGS. 1A and 1B show the electronic device 1000 in which the folding axis FX is substantially parallel to a short axis (or side) of the electronic device 1000; however, embodiments are not limited thereto or thereby. For example, the folding axis FX may extend to be substantially parallel to a long axis of the electronic device 1000, e.g., a direction substantially parallel to the first direction DR1. In this case, the first area 1000A1, the second area 1000A2, and the third area 1000A3 may be sequentially arranged in the second direction DR2.

The electronic device 1000 may include a plurality of sensing areas 100SA1, 100SA2, and 100SA3. FIG. 1A shows three sensing areas 100SA1, 100SA2, and 100SA3 as a representative example; however, the number of the sensing areas 100SA1, 100SA2, and 100SA3 are not limited to three or any other particular number.

The sensing areas 100SA1, 100SA2, and 100SA3 may include a first sensing area 100SA1, a second sensing area 100SA2, and a third sensing area 100SA3. For example, the first sensing area 100SA1 may overlap a camera module 2100 (refer to FIG. 4), and the second sensing area 100SA2 and the third sensing area 100SA3 may overlap a proximity illumination sensor 2200 (refer to FIG. 4); however, embodiments are not limited thereto or thereby.

Each of a plurality of electronic modules 2000 (refer to FIG. 4) may receive an external input provided thereto through at least one of the first sensing area 100SA1, the second sensing area 100SA2, and the third sensing area 100SA3 or may provide an output through at least one of the first sensing area 100SA1, the second sensing area 100SA2, and the third sensing area 100SA3.

The first sensing area 100SA1 may be surrounded by the active area 1000A, and the second sensing area 100SA2 and the third sensing area 100SA3 may be included in the active area 1000A. That is, the second sensing area 100SA2 and the third sensing area 100SA3 may display an image. Each of the first sensing area 100SA1, the second sensing area 100SA2, and the third sensing area 100SA3 may have a transmittance higher than a transmittance of the active area 1000A. In addition, the first sensing area 100SA1 may have a transmittance higher than each of the transmittance of the second sensing area 100SA2 and the transmittance of the third sensing area 100SA3.

According to various example embodiments, some electronic modules among the electronic modules 2000 (refer to FIG. 4) may overlap the active area 1000A, and other electronic modules among the electronic modules 2000 (refer to FIG. 4) may be surrounded by the active area 1000A. Accordingly, it is not necessary to provide an area for the arrangement of the electronic modules 2000 (refer to FIG. 4) in a peripheral area 1000NA around the active area 1000A. As a result, a ratio of size of the active area 1000A to a front surface of the electronic device 1000 may increase.

Figure 2:
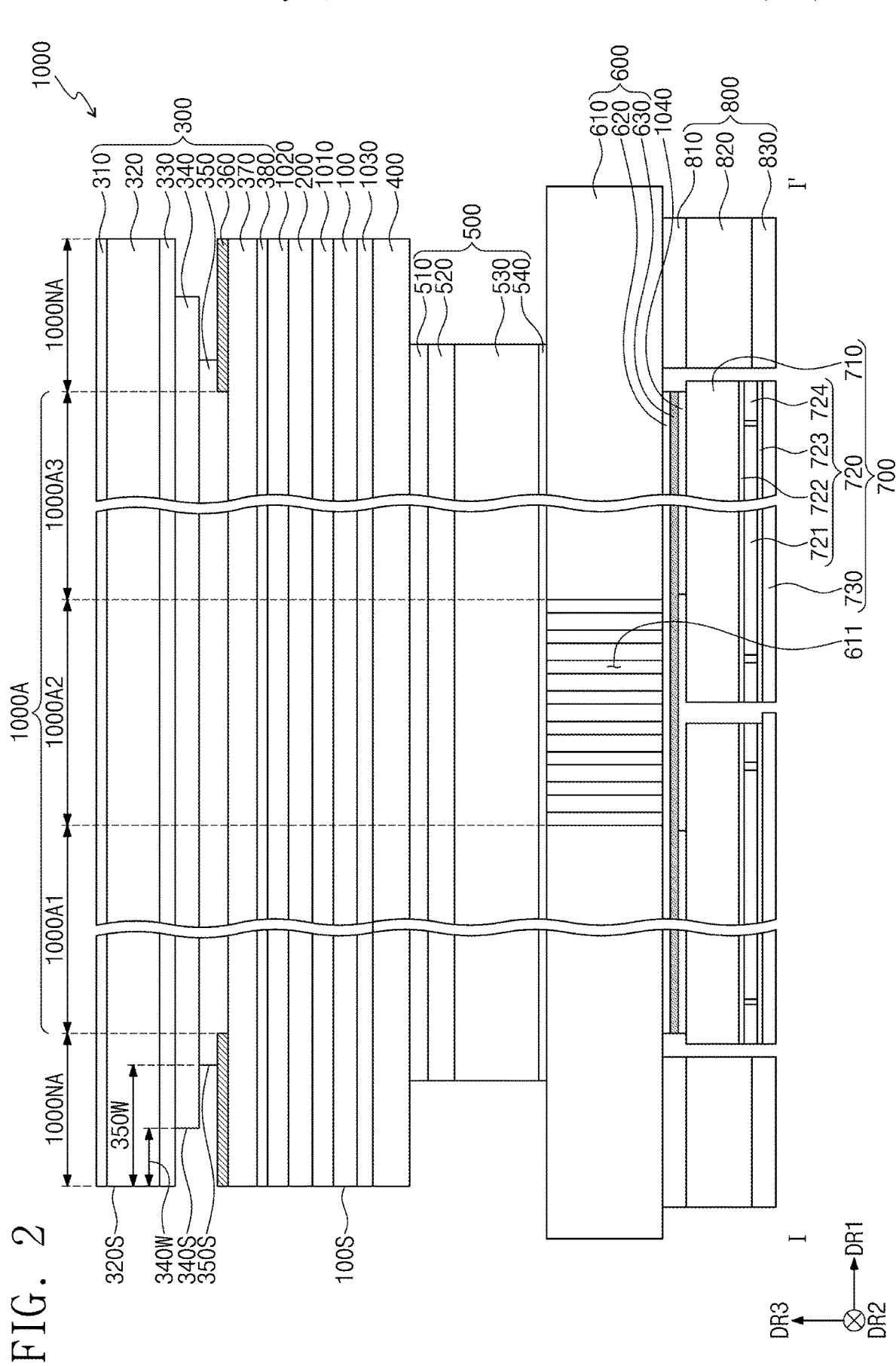
FIG. 2 is a cross-sectional view taken along sectional line I-I' of FIG. 1A according to an example embodiment.
Figure 3:
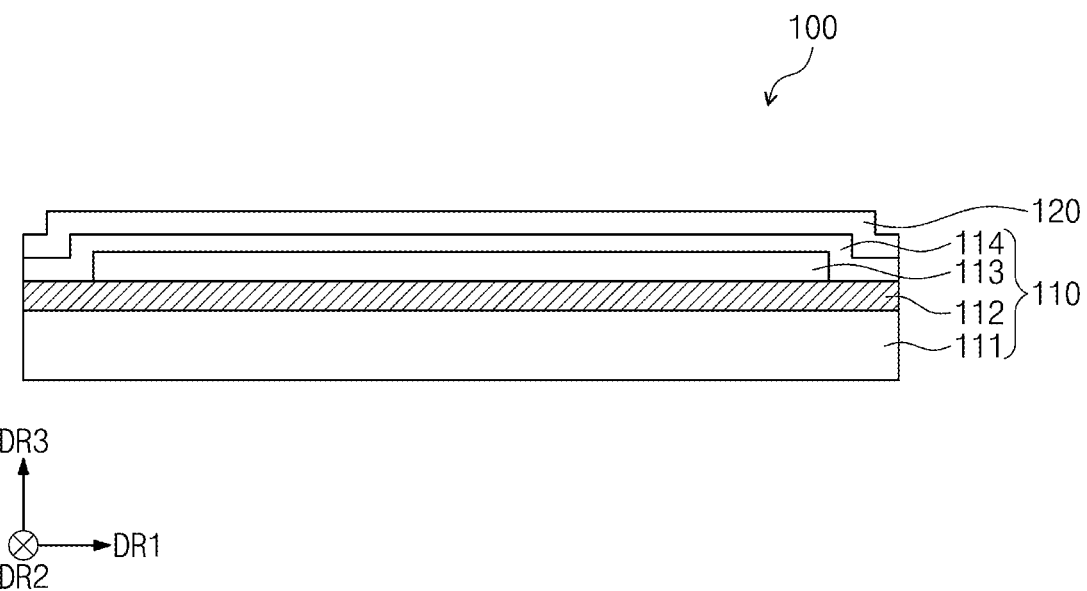
FIG. 3 is a cross-sectional view of a display panel according to an example embodiment.

FIG. 2 is a cross-sectional view taken along sectional line I-I' of FIG. 1A according to an example embodiment. FIG. 3 is a cross-sectional view showing a display panel 100 according to an example embodiment.

Referring to FIG. 2, the electronic device 1000 may include the display panel 100, upper functional layers, and lower functional layers.

Referring to FIG. 3, the display panel 100 may have a configuration that generates an image and senses an input applied thereto from the outside. For example, the display panel 100 may include a display layer 110 and a sensor layer 120. The display panel 100 may have a thickness from about 25 micrometers to about 35 micrometers, e.g., about 30 micrometers; however, the thickness of the display panel 100 is not limited thereto or thereby.

The display layer 110 may include a configuration that substantially generates the image. The display layer 110 may be a light emitting type display layer. For example, the display layer 110 may be, but is not limited to, an organic light emitting display layer, a quantum dot display layer, or a micro-LED display layer.

The display layer 110 may include a base layer 111, a circuit layer 112, a light emitting element layer 113, and an encapsulation layer 114.

The base layer 111 may include a synthetic resin film. The synthetic resin film may include a heat-curable resin. The base layer 111 may have a multi-layer structure. For instance, the base layer 111 may have a three-layer structure of a synthetic resin layer, an adhesive layer, and a synthetic resin layer. For example, the synthetic resin layer may be a polyimide-based resin layer; however, the material for the synthetic resin layer is not limited thereto or thereby. The synthetic resin layer may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin, and a perylene-based resin. The base layer 111 may include a glass substrate or an organic/inorganic composite substrate.

The circuit layer 112 may be disposed on the base layer 111. The circuit layer 112 may include an insulating layer, a semiconductor pattern, a conductive pattern, and a signal line. One or more of the insulating layer, the semiconductor layer, and the conductive layer may be formed on the base layer 111 by a coating or depositing process. The insulating layer, the semiconductor layer, and the conductive layer may be selectively patterned by a plurality of photolithography processes. The semiconductor pattern, the conductive pattern, and the signal line included in the circuit layer 112 may be formed.

The light emitting element layer 113 may be disposed on the circuit layer 112. The light emitting element layer 113 may include a light emitting element. For example, the light emitting element layer 113 may include an organic light emitting material, a quantum dot, a quantum rod, or a micro-LED, but embodiments are not limited thereto or thereby.

The encapsulation layer 114 may be disposed on the light emitting element layer 113. The encapsulation layer 114 may include an inorganic layer, an organic layer, and an inorganic layer, which are sequentially stacked; however, layers included in the encapsulation layer 114 are not limited thereto or thereby.

The inorganic layers may protect the light emitting element layer 113 from moisture and/or oxygen, and the organic layer may protect the light emitting element layer 113 from a foreign substance, such as dust particles. The inorganic layers may include at least one of a silicon nitride layer, a silicon oxynitride layer, a silicon oxide layer, a titanium oxide layer, and an aluminum oxide layer. The organic layer may include an acrylic-based organic layer, but it is not limited thereto or thereby.

The sensor layer 120 may be disposed on the display layer 110. The sensor layer 120 may sense an external input applied thereto from the outside. For example, the external input may be a user's input, e.g., a touch interaction. The user input may include a variety of external inputs, such as a part of user's body, light, heat, pen, pressure, etc.

The sensor layer 120 may be formed on the display layer 110 through successive processes. In this case, it may be expressed that the sensor layer 120 is disposed directly on the display layer 110. The expression that a component "B" is disposed directly on a component "A" means that no intervening elements are present between the component "B" and the component "A." That is, a separate adhesive member may not be disposed between the sensor layer 120 and the display layer 110. In another embodiment, the sensor layer 120 may be combined with the display layer 110 by an adhesive member. The adhesive member may include an ordinary adhesive, such as a pressure sensitive adhesive (PSA) layer, an optically clear adhesive (OCA), an optical clear resin (OCR), etc.

Referring to FIG. 2 again, the upper functional layers may be disposed on the display panel 100. For example, the upper functional layers may include an anti-reflective member 200 and an upper member 300.

The anti-reflective member 200 may be referred to as an anti-reflective layer. The anti-reflective member 200 may reduce a reflectance of an external light incident thereto from the outside. The anti-reflective member 200 may include a stretching type synthetic resin film. For example, the anti-reflective member 200 may be provided by dying an iodine compound on a polyvinyl alcohol film (PVA film). However, this is merely example, and a material for the anti-reflective member 200 is not limited thereto or thereby. The anti-reflective member 200 may have a thickness from about 25 micrometers to about 35 micrometers, e.g., about 31 micrometers; however, the thickness of the anti-reflective member 200 is not limited thereto or thereby.

The anti-reflective member 200 may be coupled to the display panel 100 by a first adhesive layer 1010. The first adhesive layer 1010 may be a transparent adhesive layer, such as a pressure sensitive adhesive (PSA) film, an optically clear adhesive (OCA) film, or an optically clear resin (OCR). The adhesive layer described, hereinafter, may include a conventional adhesive. The first adhesive layer 1010 may have a thickness from about 20 micrometers to about 30 micrometers, e.g., about 25 micrometers; however, the thickness of the first adhesive layer 1010 is not limited thereto or thereby.

In some example embodiments, the first adhesive layer 1010 may be omitted, and in this case, the anti-reflective member 200 may be disposed directly on the display panel 100. In this case, a separate adhesive layer may not be disposed between the anti-reflective member 200 and the display panel 100.

The upper member 300 may be disposed on the anti-reflective member 200. The upper member 300 may include a first hard coating layer 310, a protective layer 320, a first upper adhesive layer 330, a window 340, a second upper adhesive layer 350, a light blocking layer 360, an impact absorbing layer 370, and a second hard coating layer 380. Components included in the upper member 300 is not limited thereto or thereby. At least some components among the above-mentioned components may be omitted, and other components may be added.

The first hard coating layer 310 may be disposed at an outermost surface of the electronic device 1000. The first hard coating layer 310 may be coated on the protective layer 320 as a functional layer that improves characteristics of use of the electronic device 1000. For example, the first hard coating layer 310 may improve anti-fingerprint characteristics, anti-pollution characteristics, scratch-resistant characteristics, and/or the like.

The protective layer 320 may be disposed under the first hard coating layer 310. The protective layer 320 may protect components disposed thereunder. The first hard coating layer 310 and an anti-fingerprint layer may be additionally provided on the protective layer 320 to improve properties, such as chemical resistance and abrasion resistance. The protective layer 320 may include a film having an elastic modulus less than or equal to about 15 GPa at room temperature. The protective layer 320 may have a thickness from about 50 micrometers to about 60 micrometers, e.g., about 55 micrometers; however, the thickness of the protective layer 320 is not limited thereto or thereby. According to an example embodiment, the protective layer 320 may be omitted.

The first upper adhesive layer 330 may be disposed under the protective layer 320. The protective layer 320 may be coupled to the window 340 by the first upper adhesive layer 330. The first upper adhesive layer 330 may have a thickness from about 20 micrometers to about 30 micrometers, e.g., about 25 micrometers; however, the thickness of the first upper adhesive layer 330 is not limited thereto or thereby.

The window 340 may be disposed under the first upper adhesive layer 330. The window 340 may include an optically transparent insulating material. For example, the window 340 may include at least one of a glass substrate and a synthetic resin film. When the window 340 is the glass substrate, the window 340 may have a thickness less than or equal to about 80 micrometers, e.g., about 30 micrometers; however, the thickness of the window 340 is not limited thereto or thereby. When the window 340 is the synthetic resin film, the window 340 may include at least one of a polyimide (PI) film and a polyethylene terephthalate (PET) film, but embodiments are not limited thereto or thereby.

The window 340 may have a single-layer or multi-layer structure. For example, the window 340 may include a plurality of synthetic resin films coupled to each other by an adhesive or the glass substrate, and the synthetic resin film coupled to the glass substrate by the adhesive.

The second upper adhesive layer 350 may be disposed under the window 340. The window 340 may be coupled to the impact absorbing layer 370 by the second upper adhesive layer 350. The second upper adhesive layer 350 may have a thickness from about 30 micrometers to about 40 micrometers, e.g., about 35 micrometers; however, the thickness of the second upper adhesive layer 350 is not limited thereto or thereby.

According to some example embodiments, a sidewall 340S of the window 340 and a sidewall 350S of the second upper adhesive layer 350 may be disposed at an inner side of sidewalls of other layers, e.g., a sidewall 100S of the display panel 100 and a sidewall 320S of the protective layer 320. For the purposes of this disclosure, the expression "component A is disposed at an inner side of component B" may mean that the sidewall of component A is closer to the active area 1000A than the sidewall of the component B.

A positional relationship between the layers may be changed by the folding operation of the electronic device 1000. According some example embodiments, since the sidewall 340S of the window 340 is disposed at the inner side of the sidewall 100S of the display panel 100 and the sidewall 320S of the protective layer 320, a probability that the sidewall 340S of the window 340 protruding more than the sidewall 320S of the protective layer 320 may be reduced even though the positional relationship between the layers is changed. Accordingly, a probability that an external impact is transferred through the sidewall 340S of the window 340 may be reduced, and a crack occurrence in the window 340 may be reduced.

A first distance 340W between the sidewall 340S of the window 340 and the sidewall 320S of the protective layer 320 may be greater than or equal to a predetermined distance. In some example embodiments, the first distance 340W may be a distance in a direction that is substantially parallel to the first direction DR1. In addition, the first distance 340W may correspond to a distance between the sidewall 340S and the sidewall 320S when viewed in (or on) a plane.

The first distance 340W may be in a range from about 180 micrometers to about 205 micrometers, e.g., about 196 micrometers; however, it is not limited thereto or thereby. For example, the first distance 340W may be greater than or equal to about 50 micrometers and may be about 300 micrometers. As the first distance 340W increases, the protective layer 320 may protrude more than the window 340, and a portion of the protective layer 320 may be bent to be attached to other components, e.g., a case. In addition, as the area of the protective layer 320 increases, a probability that a foreign substance from an upper portion of the protective layer 320 entering a lower portion of the protective layer 320 may be reduced.

In addition, the window 340 and the second upper adhesive layer 350 may be attached to the impact absorbing layer 370 through a lamination process, but embodiments are not limited thereto or thereby. In consideration of a tolerance of the lamination process, an area of each of the window 340 and the second upper adhesive layer 350 may be smaller than an area of the impact absorbing layer 370. In addition, the area of the second upper adhesive layer 350 may be smaller than the area of the window 340. A pressure may be applied to the second upper adhesive layer 350 during a process of attaching the window 340. The second upper adhesive layer 350 may be elongated in a direction substantially parallel to the first direction DR1 and the second direction DR2 due to the pressure applied thereto. In this case, the area of the second upper adhesive layer 350 may be smaller than the area of the window 340 so that the second upper adhesive layer 350 does not protrude more than the window 340.

When the first upper adhesive layer 330 is attached to the second upper adhesive layer 350, a buckling phenomenon may occur on the window 340 since the window 340 does not slip during the folding operation of the electronic device 1000. However, according to some example embodiments, the area of the second upper adhesive layer 350 is smaller than the area of the window 340. Accordingly, the first upper adhesive layer 330 may not be attached to the second upper adhesive layer 350, and a probability that a foreign substance is adhered to the second upper adhesive layer 350 may be reduced.

A second distance 350W between the sidewall 350S of the second upper adhesive layer 350 and the sidewall 320S of the protective layer 320 may be greater than or equal to a predetermined distance. In some example embodiments, the second distance 350W may be a distance in a direction that is substantially parallel to the first direction DR1. In addition, the second distance 350W may correspond to a distance between the sidewall 350S and the sidewall 320S when viewed in a plane.

The second distance 350W may be about 392 micrometers, however, it is not limited thereto or thereby. For example, the second distance 350W may be in a range from about 292 micrometers to about 492 micrometers, however, it is not limited thereto or thereby. The light blocking layer 360 may be disposed between the impact absorbing layer 370 and the second upper adhesive layer 350. The light blocking layer 360 may be provided by being printed on an upper surface of the impact absorbing layer 370. The light blocking layer 360 may overlap the peripheral area 1000NA. The light blocking layer 360 may be a colored layer and may be formed by a coating method. The light blocking layer 360 may include a colored organic material or an opaque metal, and materials constituting the light blocking layer 360 are not limited thereto or thereby.

In FIG. 2, the light blocking layer 360 is disposed on the upper surface of the impact absorbing layer 370, however, a location of the light blocking layer 360 is not limited thereto or thereby. For example, the light blocking layer 360 may be disposed on an upper surface of the protective layer 320, a lower surface of the protective layer 320, an upper surface of the window 340, or a lower surface of the window 340. In addition, the light blocking layer 360 may include a plurality of layers. In this case, some layers of the light blocking layer 360 may be disposed on the upper surface of the impact absorbing layer 370, and the other layers of the light blocking layer 360 may be disposed on the upper surface of the protective layer 320, the lower surface of the protective layer 320, the upper surface of the window 340, and/or the lower surface of the window 340.

The impact absorbing layer 370 may be a functional layer to protect the display panel 100 from external impacts. The impact absorbing layer 370 may be selected from films having an elastic modulus greater than or equal to about 1 GPa at room temperature. The impact absorbing layer 370 may be a stretch film that includes an optical function. For example, the impact absorbing layer 370 may be an optical axis control film whose optical axis is controlled. The impact absorbing layer 370 may have a thickness from about 35 micrometers to about 45 micrometers, e.g., about 41 micrometers; however, the thickness of the impact absorbing layer 370 is not limited thereto or thereby. In some example embodiments, the impact absorbing layer 370 may be omitted.

The second hard coating layer 380 may be disposed on a surface of the impact absorbing layer 370. The impact absorbing layer 370 may include an uneven surface. The upper surface of the impact absorbing layer 370 may be in contact with the second upper adhesive layer 350. Accordingly, the uneven surface of the upper surface of the impact absorbing layer 370 may be filled with the second upper adhesive layer 350. Accordingly, optical issues may not occur on the upper surface of the impact absorbing layer 370. A lower surface of the impact absorbing layer 370 may be planarized by the second hard coating layer 380. For example, in a case where a first hole 101H (refer to FIG. 4) that is defined by cutting through to a second adhesive layer 1020 is provided, a surface exposed through the first hole 101H (refer to FIG. 4) may be smooth. Accordingly, as the second hard coating layer 380 covers the uneven surface of the impact absorbing layer 370, a haze that occurs on the uneven surface may be prevented.

The upper member 300 may be coupled to the anti-reflective member 200 by the second adhesive layer 1020. The second adhesive layer 1020 may include a conventional adhesive. The second adhesive layer 1020 may have a thickness from about 20 micrometers to about 30 micrometers, e.g., about 25 micrometers; however, the thickness of the second adhesive layer 1020 is not limited thereto or thereby.

The lower functional layers may be disposed under the display panel 100. For example, the lower functional layers may include a lower protective film 400, a cushion member 500, a first lower member 600, a second lower member 700, and a step difference compensation member 800. The components included in the lower functional layers are not limited thereto or thereby. At least some components of the aforementioned components may be omitted and/or other components may be added as components of the lower functional layers.

The lower protective film 400 may be coupled to a rear surface of the display panel 100 by a third adhesive layer 1030. The lower protective film 400 may prevent scratches from occurring on the rear surface of the display panel 100 during a manufacturing process of the display panel 100. The lower protective film 400 may be a colored polyimide film. For example, the lower protective film 400 may be an opaque yellow film, however, it is not limited thereto or thereby.

The lower protective film 400 may have a thickness from about 30 micrometers to about 50 micrometers, e.g., about 40 micrometers. The third adhesive layer 1030 may have a thickness from about 13 micrometers to about 25 micrometers, e.g., about 18 micrometers. However, the thickness of the lower protective film 400 and the thickness of the third adhesive layer 1030 are not limited thereto or thereby.

The cushion member 500 may be disposed under the lower protective film 400. The cushion member 500 may protect the display panel 100 from impacts from a lower side of the cushion member 500. An impact resistance of the electronic device 1000 may be improved by the cushion member 500.

The cushion member 500 may include a first cushion adhesive layer 510, a barrier film 520, a cushion layer 530, and a second cushion adhesive layer 540. Components included in the cushion member 500 are not limited thereto or thereby. At least some components of the aforementioned components may be omitted and/or other components may be added to the cushion member 500.

The first cushion adhesive layer 510 and the second cushion adhesive layer 540 may include a conventional adhesive. The first cushion adhesive layer 510 may be attached to the lower protective film 400, and the second cushion adhesive layer 540 may be attached to the first lower member 600. The first cushion adhesive layer 510 may have a thickness from about 20 micrometers to about 30 micrometers, e.g., about 25 micrometers. The second cushion adhesive layer 540 may have a thickness from about 4 micrometers to about 15 micrometers, e.g., about 8 micrometers. However, the thickness of the first cushion adhesive layer 510 and the thickness of the second cushion adhesive layer 540 are not limited thereto or thereby.

The barrier film 520 may be provided to improve impact resistance. The barrier film 520 may prevent the display panel 100 from being deformed. The barrier film 520 may be a synthetic resin film, e.g., a polyimide film, however, it is not limited thereto or thereby. The barrier film 520 may have a thickness from about 30 micrometers to about 40 micrometers, e.g., about 35 micrometers; however, the thickness of the barrier film 520 is not limited thereto or thereby.

The cushion layer 530 may include at least one of a foam and a sponge. The foam may include a polyurethane foam or a thermoplastic polyurethane foam. When the cushion layer 530 includes the foam, the cushion layer 530 may be formed using the barrier film 520 as its base layer. For example, the cushion layer 530 may be formed by providing a foaming agent on the barrier film 520.

The cushion layer 530 may have a thickness from about 80 micrometers to about 120 micrometers, e.g., about 100 micrometers; however, the thickness of the cushion layer 530 is not limited thereto or thereby.

At least one of the barrier film 520 and the cushion layer 530 may have a color that absorbs a light. For example, at least one of the barrier film 520 and the cushion layer 530 may have a black color. In this case, components disposed under the cushion member 500 may be prevented from being viewed from the outside.

The first lower member 600 may be disposed under the cushion member 500. The first lower member 600 may include a plate 610, a lower adhesive layer 620, and a cover layer 630. Components included in the first lower member 600 are not limited thereto or thereby. At least some components of the above-mentioned components may be omitted and/or other components may be added to the first lower member 600.

The plate 610 may include a material having an elastic modulus greater than or equal to about 60 GPa at room temperature. For example, the plate 610 may be SUS304 stainless steel, however, it is not limited thereto or thereby. The plate 610 may support components disposed thereon. In addition, a heat dissipation performance of the electronic device 1000 may be improved by the plate 610.

The plate 610 may be provided with an opening 611 defined through a portion thereof. The opening 611 may be defined to overlap the second area 1000A2. When viewed in a plane, e.g., when viewed in the third direction DR3, the opening 611 may overlap the second area 1000A2. A shape of a portion of the plate 610 may be easily changed due to the opening 611.

The cover layer 630 may be attached to the plate 610 by the lower adhesive layer 620. The lower adhesive layer 620 may include a conventional adhesive. The cover layer 630 may cover the opening 611 of the plate 610. Accordingly, it is possible to further prevent a foreign substance from entering the opening 611.

The cover layer 630 may include a material having an elastic modulus smaller than an elastic modulus of the plate 610. For example, the cover layer 630 may include a thermoplastic polyurethane, however, it is not limited thereto or thereby.

The plate 610 may have a thickness from about 120 micrometers to about 180 micrometers, e.g., about 150 micrometers. The lower adhesive layer 620 may have a thickness from about 4 micrometers to about 15 micrometers, e.g., about 8 micrometers. The cover layer 630 may have a thickness from about 4 micrometers to about 15 micrometers, e.g., about 8 micrometers. However, the thickness of the plate 610, the thickness of the lower adhesive layer 620, and the thickness of the cover layer 630 are not limited thereto or thereby.

The second lower member 700 may be disposed under the first lower member 600. The second lower member 700 may be one of a plurality of second lower members 700 that are disposed to be spaced apart from each other. For example, one second lower member 700 may be disposed in the first area 1000A1, and the other second lower member 700 may be disposed in the third area 1000A3.

Each of the second lower members 700 may be attached to the first lower member 600 by fourth adhesive layers 1040. For example, one fourth adhesive layer 1040 may be attached to a lower surface of the first lower member 600 overlapping the first area 1000A1, and the other fourth adhesive layer 1040 may be attached to a lower surface of the first lower member 600 overlapping the third area 1000A3. In some embodiments, the fourth adhesive layers 1040 may not overlap the second area 1000A2. Each of the fourth adhesive layers 1040 may have a thickness from about 8 micrometers to about 15 micrometers, e.g., about 8 micrometers; however, the thickness of each of the fourth adhesive layers 1040 is not limited thereto or thereby.

A step difference compensation film may be further disposed between each of the second lower members 700 and the first lower member 600. For example, the step difference compensation film may be disposed in an area overlapping the second area 1000A2. One surface of the step difference compensation film may have an adhesive force smaller than an adhesive force of the other surface of the step difference compensation film. For example, the one surface may not have the adhesive force. The one surface may face the first lower member 600.

Each of the second lower members 700 may include a lower plate 710, a heat dissipation sheet 720, and an insulating film 730. Components included in each of the second lower members 700 are not limited thereto or thereby. At least some components of the aforementioned components may be omitted and/or other components may be added to the second lower members 700.

The lower plate 710 may be provided in plural. One lower plate of the lower plates 710 may be disposed to overlap the first area 1000A1 and a portion of the second area 1000A2, and the other lower plate of the lower plates 710 may be disposed to overlap the third area 1000A3 and the other portion of the second area 1000A2.

The lower plates 710 may be disposed to be spaced apart from each other in the second area 1000A2. However, the lower plates 710 may be disposed as close as possible to each other to support the area where the opening 611 of the plate 610 is formed. For example, the lower plates 710 may prevent the area where the opening 611 of the plate 610 is formed from being deformed due to a pressure applied thereto from above the lower plates 710.

In addition, the lower plates 710 may prevent the components disposed on the second lower members 700 from being deformed due to the components disposed under the second lower members 700.

Each of the lower plates 710 may include a metal alloy, and for instance, each of the lower plates 710 may include a copper alloy. However, the material constituting the lower plates 710 is not limited thereto or thereby. Each of the lower plates 710 may have a thickness from about 60 micrometers to about 100 micrometers, e.g., about 80 micrometers; however, the thickness of the lower plates 710 is not limited thereto or thereby.

The heat dissipation sheet 720 may be attached to a lower portion of the lower plate 710. The heat dissipation sheet 720 may be a heat conductive sheet having high thermal conductivity. For example, the heat dissipation sheet 720 may include a heat dissipation layer 721, a first heat dissipation adhesive layer 722, a second heat dissipation adhesive layer 723, and a gap tape 724.

The gap tape 724 may be attached to the first heat dissipation adhesive layer 722 and the second heat dissipation adhesive layer 723 spaced apart from the first heat dissipation adhesive layer 722 with the heat dissipation layer 721 disposed therebetween. The gap tape 724 may include a plurality of layers. For example, the gap tape 724 may include a base layer, an upper adhesive layer disposed on an upper surface of the base layer, and a lower adhesive layer disposed on a lower surface of the base layer.

The heat dissipation layer 721 may be attached to the lower plate 710 by the first heat dissipation adhesive layer 722. The heat dissipation layer 721 may be sealed by the first heat dissipation adhesive layer 722, the second heat dissipation adhesive layer 723, and the gap tape 724. The heat dissipation layer 721 may be a graphitized polymer film. The polymer film may be, for example, a polyimide film. Each of the first heat dissipation adhesive layer 722 and the second heat dissipation adhesive layer 723 may have a thickness from about 3 micrometers to about 8 micrometers, e.g., about 5 micrometers. Each of the heat dissipation layer 721 and the gap tape 724 may have a thickness from about 10 micrometers to about 25 micrometers, e.g., about 17 micrometers. However, the thickness of each of the first heat dissipation adhesive layer 722, the second heat dissipation adhesive layer 723, the heat dissipation layer 721, and the gap tape 724 is not limited thereto or thereby.

The insulating film 730 may be attached to a lower portion of the heat dissipation sheet 720. For example, the insulating film 730 may be attached to the second heat dissipation adhesive layer 723. The insulating film 730 may prevent a rattle from being generated in the electronic device 1000. The insulating film 730 may have a thickness of about 15 micrometers, however, it is not limited thereto or thereby.

The step difference compensation member 800 may be attached to a lower portion of the plate 610. For example, the lower adhesive layer 620 may be attached to a portion of the lower portion of the plate 610, and the step difference compensation member 800 may be attached to another portion of the lower portion of the plate 610.

The step difference compensation member 800 may include a first compensation adhesive layer 810, a step difference compensation film 820, and a second compensation adhesive layer 830. The first compensation adhesive layer 810 may be attached to a lower surface of the plate 610. The step difference compensation film 820 may be a synthetic resin film. The second compensation adhesive layer 830 may be attached to a lower surface of the step difference compensation film 820 and a set (not shown).

Figure 4:
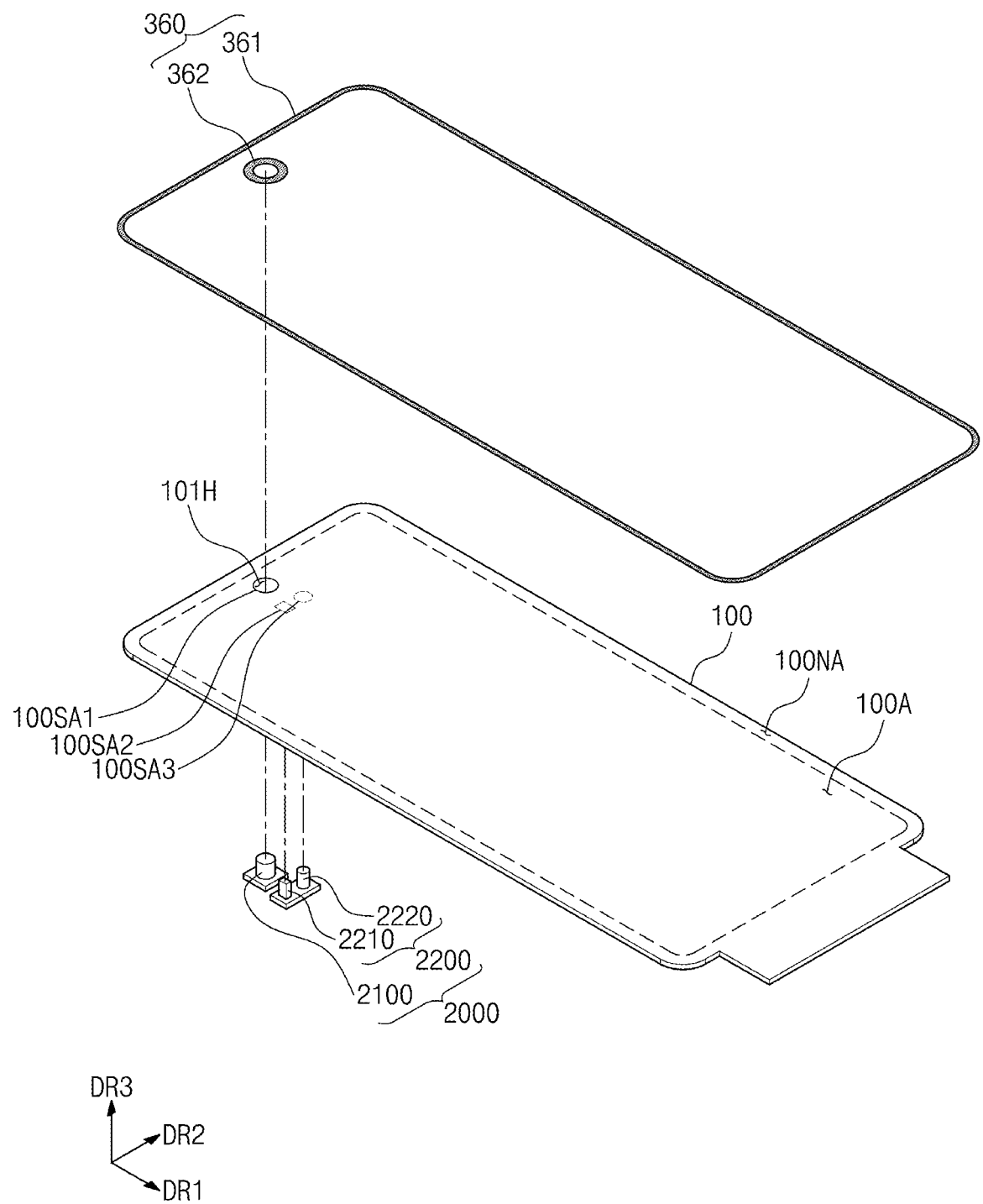
FIG. 4 is an exploded perspective view showing some components of an electronic device according to an example embodiment.

FIG. 4 is an exploded perspective view showing some components of the electronic device according to an example embodiment.

Referring to FIG. 4, the light blocking layer 360, the display panel 100, and the electronic modules 2000 among the components of the electronic device 1000 (refer to FIG. 2) are shown. The electronic modules 2000 may include a camera module 2100 and a proximity illumination sensor 2200.

The proximity illumination sensor 2200 may include a light emitting module 2210 and a light receiving module 2220. The light emitting module 2210 and the light receiving module 2220 may be mounted on one substrate. The light emitting module 2210 may generate and emit a light. For example, the light emitting module 2210 may emit an infrared ray, and the light emitting module 2210 may include a light emitting diode. The light receiving module 2220 may sense the infrared ray. The light receiving module 2220 may be activated when the infrared ray of a predetermined level or higher is detected. The light receiving module 2220 may include a complementary metal oxide semiconductor (CMOS) sensor. The infrared ray generated by and emitted from the light emitting module 2210 may be reflected by an external subject, e.g., a finger or face of a user, and the reflected infrared ray may be incident to the light receiving module 2220.

The display panel 100 may include an active area 100A and a peripheral area 100NA, which are defined therein. The active area 100A may correspond to the active area 1000A shown in FIG. 1A, and the peripheral area 100NA may correspond to the peripheral area 1000NA shown in FIG. 1A.

The first sensing area 100SA1 overlapping the camera module 2100 may be surrounded by the active area 100A, and the second sensing area 100SA2 overlapping the light emitting module 2210 and the third sensing area 100SA3 overlapping the light receiving module 2220 may be portions of the active area 100A.

The display panel 100 may be provided with the first hole 101H defined through a portion thereof. The first hole 101H may be defined to overlap the first sensing area 100SA1.

Accordingly, the camera module 2100 may receive an external input transmitted through the first hole 101H.

The light blocking layer 360 may include a first light blocking pattern 361 and a second light blocking pattern 362. The first light blocking pattern 361 may be a pattern that covers the peripheral area 100NA. The second light blocking pattern 362 may surround the camera module 2100 when viewed in a plane.

Figure 5:
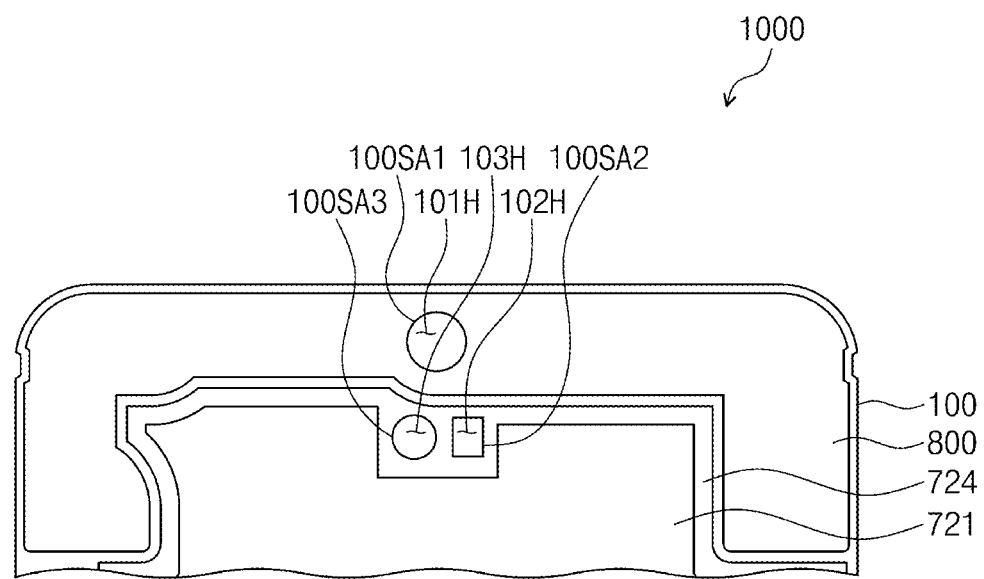
FIG. 5 is a rear view showing some components of an electronic device according to an example embodiment.

FIG. 5 is a rear view showing some components of the electronic device 1000 according to an example embodiment.

Referring to FIGS. 4 and 5, the display panel 100, the step difference compensation member 800, the heat dissipation layer 721, and the gap tape 724 are shown.

The first hole 101H, a second hole 102H, and a third hole 103H may be defined to respectively correspond to the first sensing area 100SA1, the second sensing area 100SA2, and the third sensing area 100SA3.

The first hole 101H, the second hole 102H, and the third hole 103H may be defined by removing portions of some components of the electronic device 1000 (refer to FIG. 1A), and detailed descriptions thereof will be described later.

The first hole 101H may be defined to overlap the step difference compensation member 800, and each of the second hole 102H and the third hole 103H may be defined to overlap the gap tape 724. Accordingly, when viewed in a plane, the first hole 101H may be surrounded by the step difference compensation member 800, and each of the second hole 102H and the third hole 103H may be surrounded by the gap tape 724.

Figure 6:
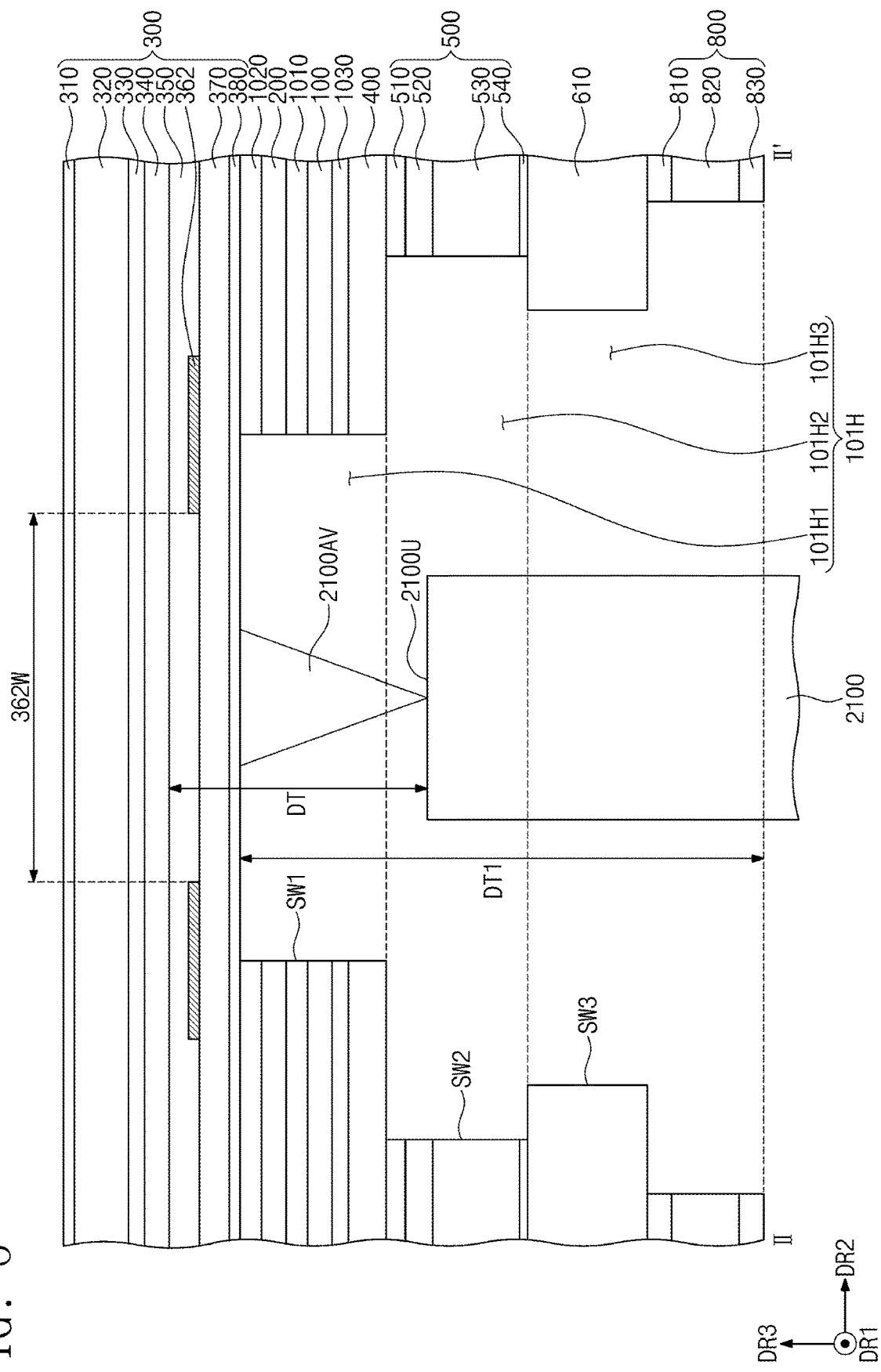
FIG. 6 is a cross-sectional view taken along sectional line II-IF of FIG. 1A according to an example embodiment.

FIG. 6 is a cross-sectional view taken along sectional line II-IF of FIG. 1A according to an example embodiment.

Referring to FIG. 6, the first hole 101H into which the camera module 2100 is inserted is shown. The first hole 101H may include a first hole portion 101H1, a second hole portion 101H2, and a third hole portion 101H3.

The first hole portion 101H1 may be defined by a first sidewall SW1, the second hole portion 101H2 may be defined by a second sidewall SW2, and the third hole portion 101H3 may be defined by a third sidewall SW3.

The first hole portion 101H1, the second hole portion 101H2, and the third hole portion 101H3 may have different sizes from each other. For example, the first hole portion 101H1 may have the smallest size, the second hole portion 101H2 may have the largest size, and the third hole portion 101H3 may have a size between the size of the first hole portion 101H1 and the size of the second hole portion 101H2.

The first hole portion 101H1 may be formed by a laser cutting process. For example, the lower protective film 400, the second adhesive layer 1020, and components disposed between the lower protective film 400 and the second adhesive layer 1020 may be cut using a laser beam. The second hole portion 101H2 may be a portion provided in the cushion member 500, and the cushion member 500 may be blanked (punched and cut out) to form the second hole portion 101H2. The cushion member 500 in which the second hole portion 101H2 is formed may be attached to the lower protective film 400. The plate 610 and the step difference compensation member 800 may be blanked (punched and cut out) to form the third hole portion 101H3. The third hole portion 101H3 may be formed by a shearing process on the plate 610 and the step difference compensation member 800.

According to some example embodiments, the cushion member 500 in which the second hole portion 101H2 is formed may be attached to the plate 610 in which the third hole portion 101H3 is formed, and then the cushion member 500 may be attached to the lower protective film 400. Accordingly, the first hole portion 101H1, the second hole portion 101H2, and the third hole portion 101H3 may have different sizes from each other by taking into account a component tolerance, an installation tolerance, and a folding tolerance.

The folding tolerance may be tolerances generated by the folding operation of the electronic device 1000. For example, the folding tolerance may be a tolerance considering a movement (or slip) of each component when the electronic device 1000 is fully folded and a tolerance considering an unrestored movement of each component when the electronic device 1000 is unfolded after being folded.

According to some example embodiments, since sizes of the first hole portion 101H1, the second hole portion 101H2, and the third hole portion 101H3 are determined by taking into account the folding tolerance, interference may not occur between an inner sidewall of the first hole 101H and the electronic module inserted into the first hole 101H, for example, the camera module 2100. In addition, the second light blocking pattern 362 that is disposed corresponding to a position of the first hole 101H may be disposed by taking into account the folding tolerance. Accordingly, although the electronic device 1000 may be folded or unfolded, a probability that the second light blocking pattern 362 covers the active area 100A (refer to FIG. 4) of the display panel 100 or covers a field of view area 2100AV of the camera module 2100 may be reduced.

The camera module 2100 may be inserted into and disposed in the first hole 101H. The second upper adhesive layer 350, the light blocking layer 360, the impact absorbing layer 370, and the second hard coating layer 380 may be disposed between the camera module 2100 and the window 340. Accordingly, since at least one layer is disposed between the camera module 2100 and the window 340, a probability that the window 340 is damaged due to the camera module 2100 may be reduced. Thus, the product reliability may be improved.

An upper surface 2100U of the camera module 2100 may be disposed in the second hole portion 101H2 provided in the cushion member 500. The second hole portion 101H2 may be a hole portion having the greatest diameter among the first, second, and third hole portions 101H1, 101H2, and 101H3. Accordingly, even though the positional relationship between the layers may be changed when the electronic device 1000 is folded, the camera module 2100 may not collide with the second sidewall SW2. Thus, the product reliability may be improved.

A position of the upper surface 2100U of the camera module 2100 is not limited to that shown in FIG. 6. For example, the upper surface 2100U of the camera module 2100 may be disposed in the first hole portion 101H1. In this case, a width 362W of an area surrounded by the second light blocking pattern 362 may be designed to be smaller than that when the upper surface 2100U of the camera module 2100 is disposed in the second hole portion 101H2.

For example, the second light blocking pattern 362 may be designed not to overlap the field of view area 2100AV of the camera module 2100. When viewed in a plane, the second light blocking pattern 362 may be disposed to be spaced apart from the field of view area 2100AV of the camera module 2100 by a predetermined distance by taking into account the process tolerance. Since the camera module 2100 becomes closer to the second light blocking pattern 362, the field of view area 2100AV of the camera module 2100 may be not blocked by the second light blocking pattern 362 even though the width 362W of the area surrounded by the second light blocking pattern 362 decreases.

According to some example embodiments, a distance DT between the camera module 2100 and the window 340 may be greater than or equal to a predetermined distance. When the distance DT between the camera module 2100 and the window 340 is greater than or equal to the predetermined distance, a probability that the window 340 is damaged by the camera module 2100 may be reduced. Accordingly, the product reliability may be improved. When the window 340 is implemented as a glass substrate, the damage of the window 340 may be a crack, and when the window 340 is implemented as a synthetic resin film, the damage of the window 340 may be a dent.

For example, the distance DT may be in a range greater than or equal to about 60% and less than about 200% of a sum of thicknesses of components, each having a modulus (e.g., an elastic modulus at room temperature) less than or equal to a reference modulus (e.g., a reference elastic modulus at room temperature), among the components through which the first hole 101H is defined. In FIG. 3, the components through which the first hole 101H is defined may correspond to the components disposed under the second hard coating layer 380. The reference modulus may be less than or equal to about 100 MPa, for example, greater than or equal to about 0 MPa and less than or equal to about 50 MPa.

The components that are provided with the first hole 101H defined therethrough and have the modulus less than or equal to the reference modulus may include the first adhesive layer 1010, the second adhesive layer 1020, the third adhesive layer 1030, the first cushion adhesive layer 510, the cushion layer 530, the second cushion adhesive layer 540, the first compensation adhesive layer 810, and the second compensation adhesive layer 830.

The first adhesive layer 1010 may have a thickness of about 25 micrometers, the second adhesive layer 1020 may have a thickness of about 25 micrometers, the third adhesive layer 1030 may have a thickness of about 18 micrometers, the first cushion adhesive layer 510 may have a thickness of about 25 micrometers, the cushion layer 530 may have a thickness of about 100 micrometers, the second cushion adhesive layer 540 may have a thickness of about 8 micrometers, the first compensation adhesive layer 810 may have a thickness of about 17 micrometers, and the second compensation adhesive layer 830 may have a thickness of about 17 micrometers. Each of the thicknesses may have a process tolerance. Accordingly, the sum of the thicknesses may be in a range from about 183 micrometers to about 300 micrometers, e.g., about 235 micrometers. However, the sum of the thicknesses is not limited thereto or thereby.

The distance DT between the camera module 2100 and the window 340 may be determined by taking into account a maximum compression rate of the layers having the modulus less than or equal to the reference modulus. For instance, the distance DT may be obtained by multiplying the sum of the thicknesses by the maximum compression rate. The distance DT may be greater than or equal to about 110 micrometers, e.g., about 141 micrometers or more.

According to some example embodiments, the window 340 and the camera module 2100 may be spaced apart from each other by a predetermined distance even though the components may be compressed to the maximum due to a pressure generated while using the electronic device 1000. Accordingly, the probability that the window 340 is damaged by the camera module 2100 may be remarkably reduced. Therefore, product reliability may be improved.

Figure 7:
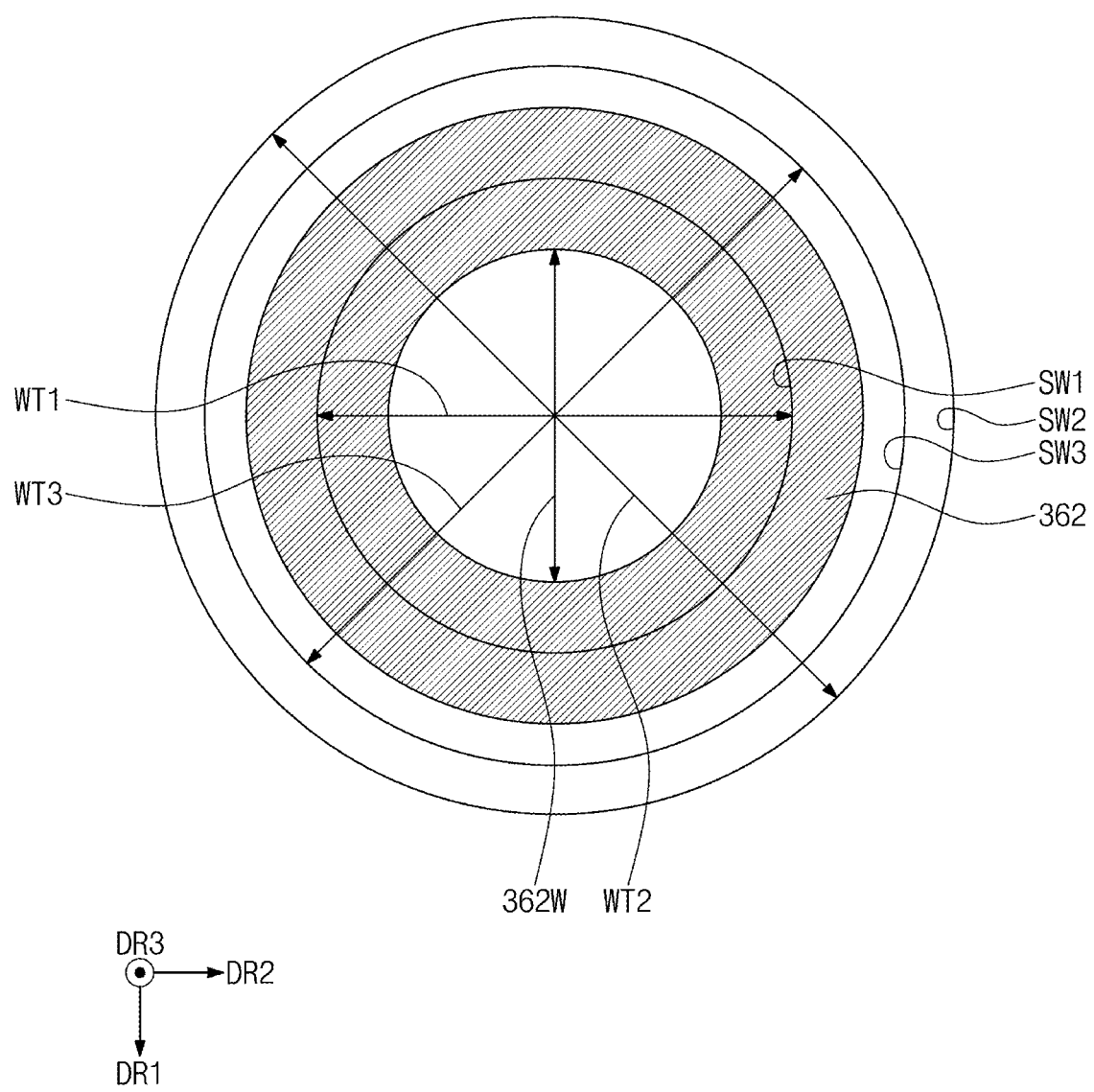
FIG. 7 is a plan view showing an electronic device according to an example embodiment.

FIG. 7 is a plan view showing the electronic device according to an example embodiment.

FIG. 7 shows the second light blocking pattern 362, the first sidewall SW1, the second sidewall SW2, and the third sidewall SW3.

When viewed in a plane, the first sidewall SW1 may overlap the second light blocking pattern 362, and the second sidewall SW2 and the third sidewall SW3 may not overlap the second light blocking pattern 362. When viewed in the plane, the third sidewall SW3 may surround the second light blocking pattern 362, and the second sidewall SW2 may surround the third sidewall SW3.

Referring to FIGS. 6 and 7, a first width WT1 of the first hole portion 101H1, a second width WT2 of the second hole portion 101H2, and a third width WT3 of the third hole portion 101H3 may be different from each other. For example, the second width WT2 may be greater than the first width WT1 and the third width WT3, and the third width WT3 may be greater than the first width WT1.

Figure 8:
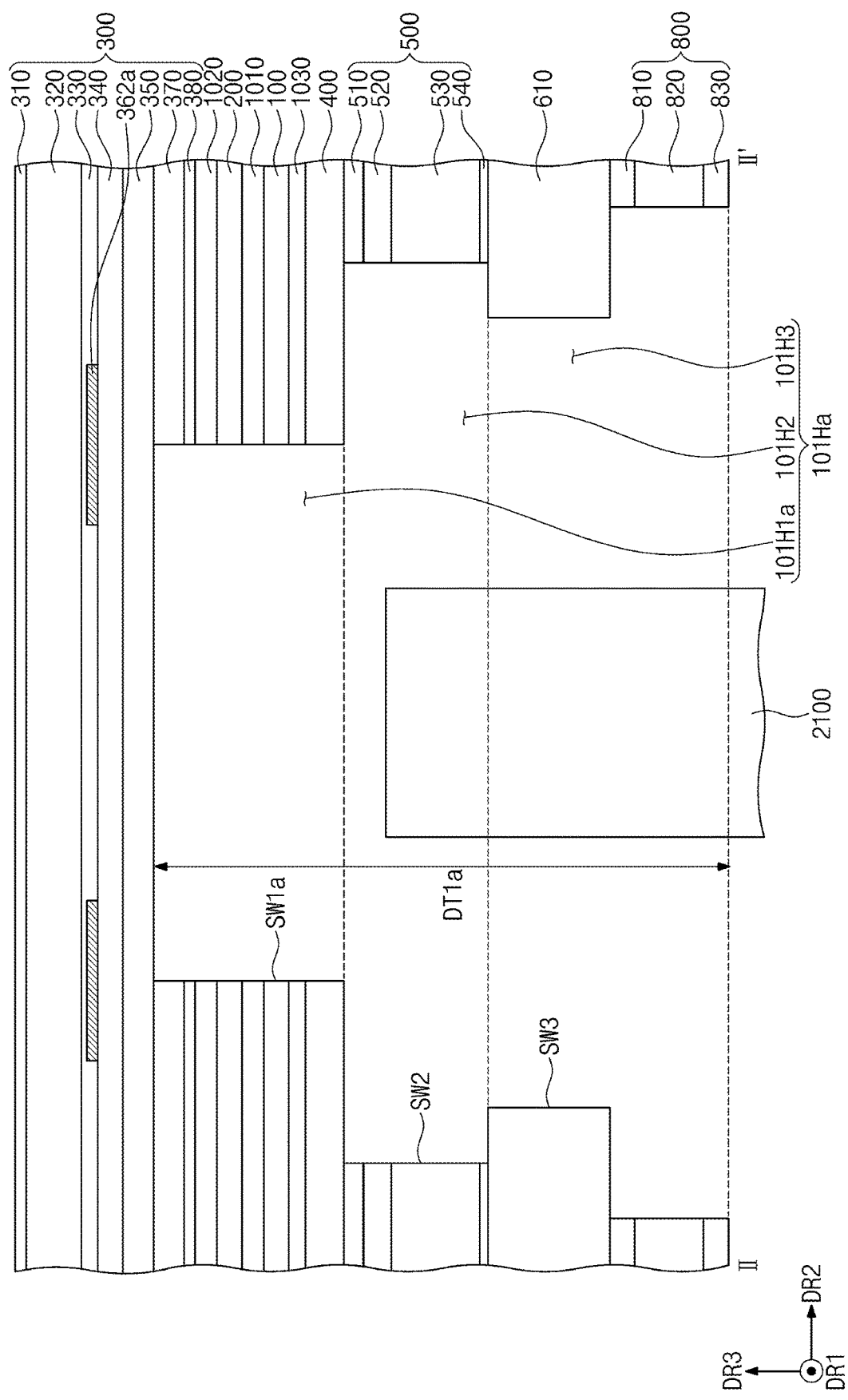
FIG. 8 is a cross-sectional view taken along sectional line II-IF of FIG. 1A according to an example embodiment.

FIG. 8 is a cross-sectional view taken along sectional line II-IF of FIG. 1A according to an example embodiment.

In FIG. 8, the same reference numerals denote the same elements in FIG. 6, and thus, detailed descriptions of the same elements will be omitted.

Referring to FIG. 8, a first hole 101Ha into which a camera module 2100 is inserted is shown. The first hole 101Ha may include a first hole portion 101H1a, a second hole portion 101H2, and a third hole portion 101H3.

The first hole portion 101H1a may be defined by a first sidewall SW1a. The first hole portion 101H1a may be formed by a laser cutting process. For example, a lower protective film 400, a second adhesive layer 1020, an impact absorbing layer 370, and layers disposed between the lower protective film 400 and the impact absorbing layer 370 may be cut by a laser beam. For instance, a depth DT1a of the first hole 101Ha shown in FIG. 8 may be greater than the depth DT1 of the first hole 101H shown in FIG. 6.

In some example embodiments, as the first hole 101Ha is defined through from the step difference compensation member 800 to the impact absorbing layer 370, the second light blocking pattern 362a may be disposed on the window 340. However, this is merely example, and a position of the second light blocking pattern 362a may be changed in various ways.

According to some example embodiments, the depth of the first hole 101Ha into which the camera module 2100 is inserted may be changed in various ways as long as the anti-reflective member 200 may be removed.

For example, the first hole 101Ha may be defined to a lower surface of a window 340. In this case, a portion of the lower surface of the window 340 may be exposed through the first hole 101Ha. When a distance between the window 340 and the camera module 2100 satisfies a predetermined condition, a collision between the window 340 and the camera module 2100 may be reduced. The distance may be greater than or equal to about 60% of a sum of thicknesses of components that satisfy the reference modulus and through which the first hole 101Ha is defined. In FIG. 8, the components through which the first hole 101Ha is defined may correspond to components disposed under the second upper adhesive layer 350.

Figure 9:
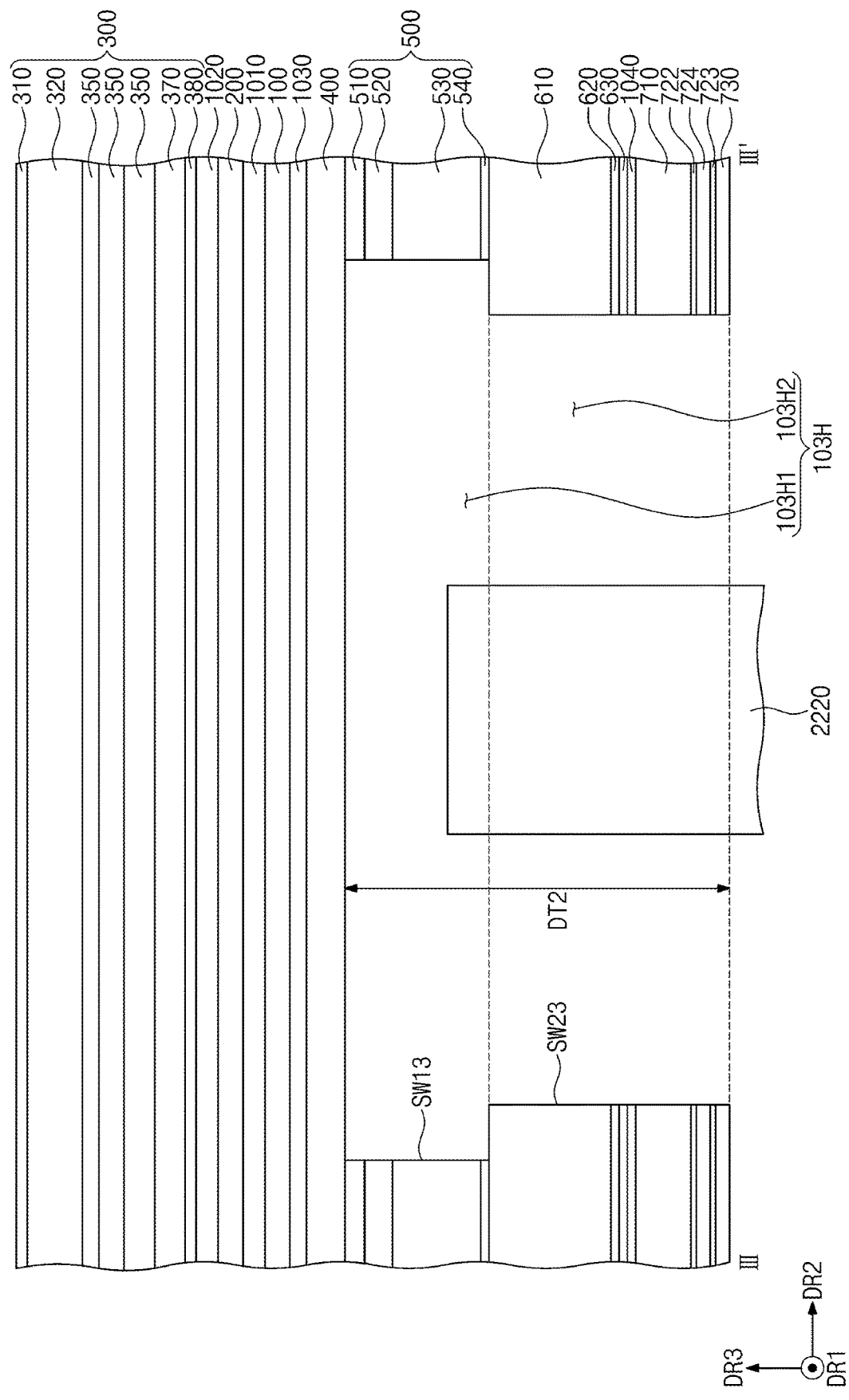
FIG. 9 is a cross-sectional view taken along sectional line of FIG. 1A according to an example embodiment.

FIG. 9 is a cross-sectional view taken along sectional line of FIG. 1A according to an example embodiment.

Referring to FIG. 9, the third hole 103H into which the light receiving module 2220 is inserted is shown. Since the second hole 102H (refer to FIG. 5) into which the light emitting module 2210 (refer to FIG. 4) is inserted has the same cross-sectional structure as the third hole 103H, descriptions about the second hole 102H (refer to FIG. 5) will be understood based on the following descriptions.

The third hole 103H may include a first hole portion 103H1 and a second hole portion 103H2. The first hole portion 103H1 may be defined by a first sidewall SW13, and the second hole portion 103H2 may be defined by a second sidewall SW23.

The first hole portion 103H1 and the second hole portion 103H2 may have different sizes from each other. For example, the size of the first hole portion 103H1 may be greater than the size of the second hole portion 103H2.

The first hole portion 103H1 may be provided in the cushion member 500, and the cushion member 500 may be blanked (punched and cut out) to form the first hole portion 103H1. The first lower member 600 and the second lower member 700 may be blanked (punched and cut out) to form the second hole portion 103H2.

The third hole 103H may not be provided in the display panel 100. For example, the third hole 103H may be provided in at least some of the components disposed under the display panel 100. Accordingly, the image may be displayed through and the external input may be sensed through the portion of the display panel 100, which overlaps the third hole 103H.

The first hole 101H (refer to FIG. 6) may penetrate through the display panel 100, however, the third hole 103H may not penetrate through the display panel 100. For instance, the depth DT1 (refer to FIG. 6) of the first hole 101H (refer to FIG. 6) may be greater than a depth DT2 of the third hole 103H.

Figure 10:
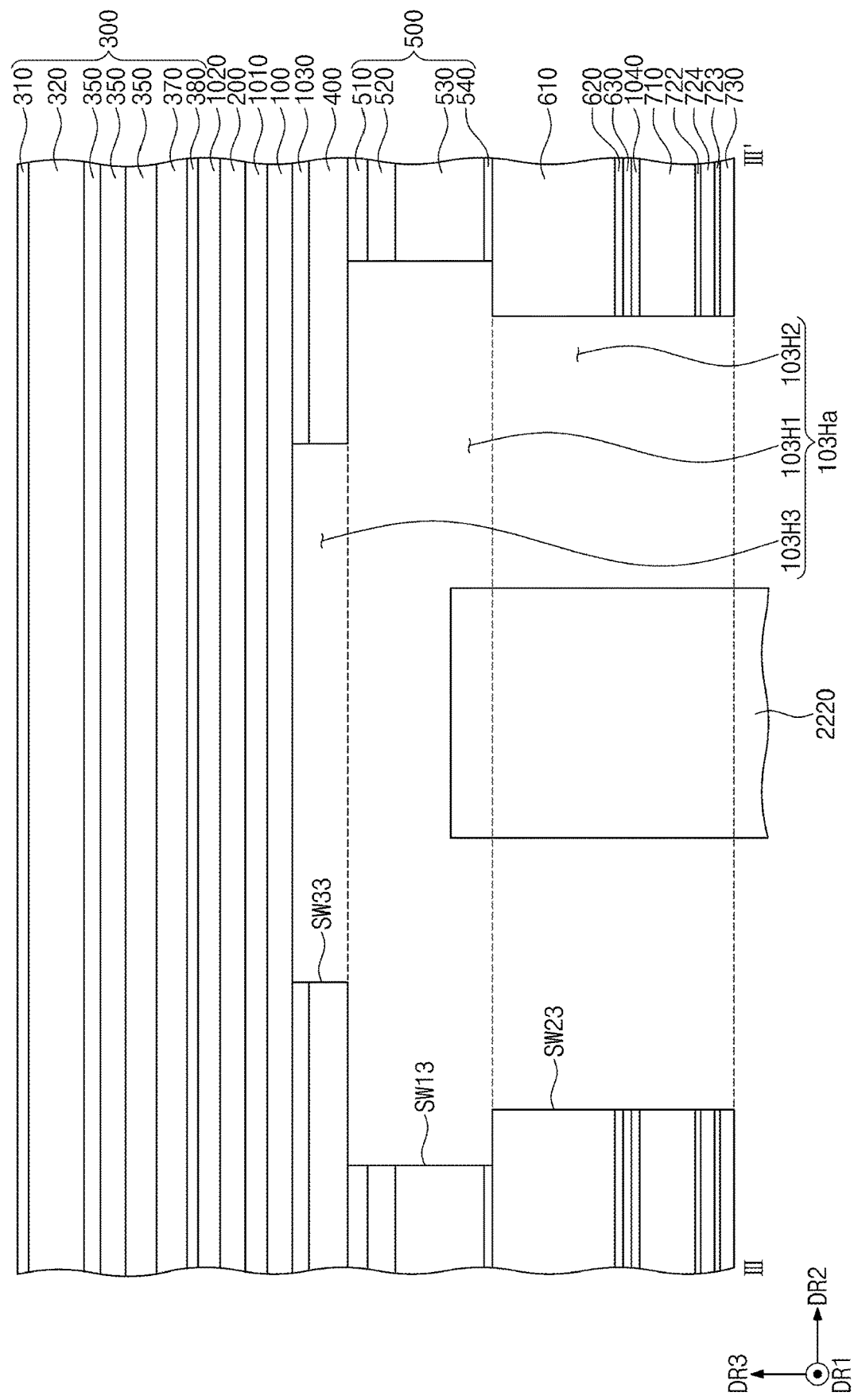
FIG. 10 is a cross-sectional view taken along sectional line of FIG. 1A according to an example embodiment.

FIG. 10 is a cross-sectional view taken along sectional line of FIG. 1A according to an example embodiment.

In FIG. 10, the same reference numerals denote the same elements in FIG. 9, and thus, detailed descriptions of the same elements will be omitted.

Referring to FIG. 10, a third hole 103Ha into which a light receiving module 2220 is inserted is shown. The third hole 103Ha may include a first hole portion 103H1, a second hole portion 103H2, and a third hole portion 103H3. The third hole portion 103H3 may have a size smaller than a size of the first hole portion 103H1 and a size of the second hole portion 103H2.

The third hole portion 103H3 may be defined by a third sidewall SW33. The third hole portion 103H3 may be formed by a laser cutting process. For example, a lower protective film 400 and a third adhesive layer 1030 may be cut by a laser beam. For instance, a depth of the third hole 103Ha shown in FIG. 10 may be greater than the depth DT2 of the third hole 103H shown in FIG. 9.

Figure 11:
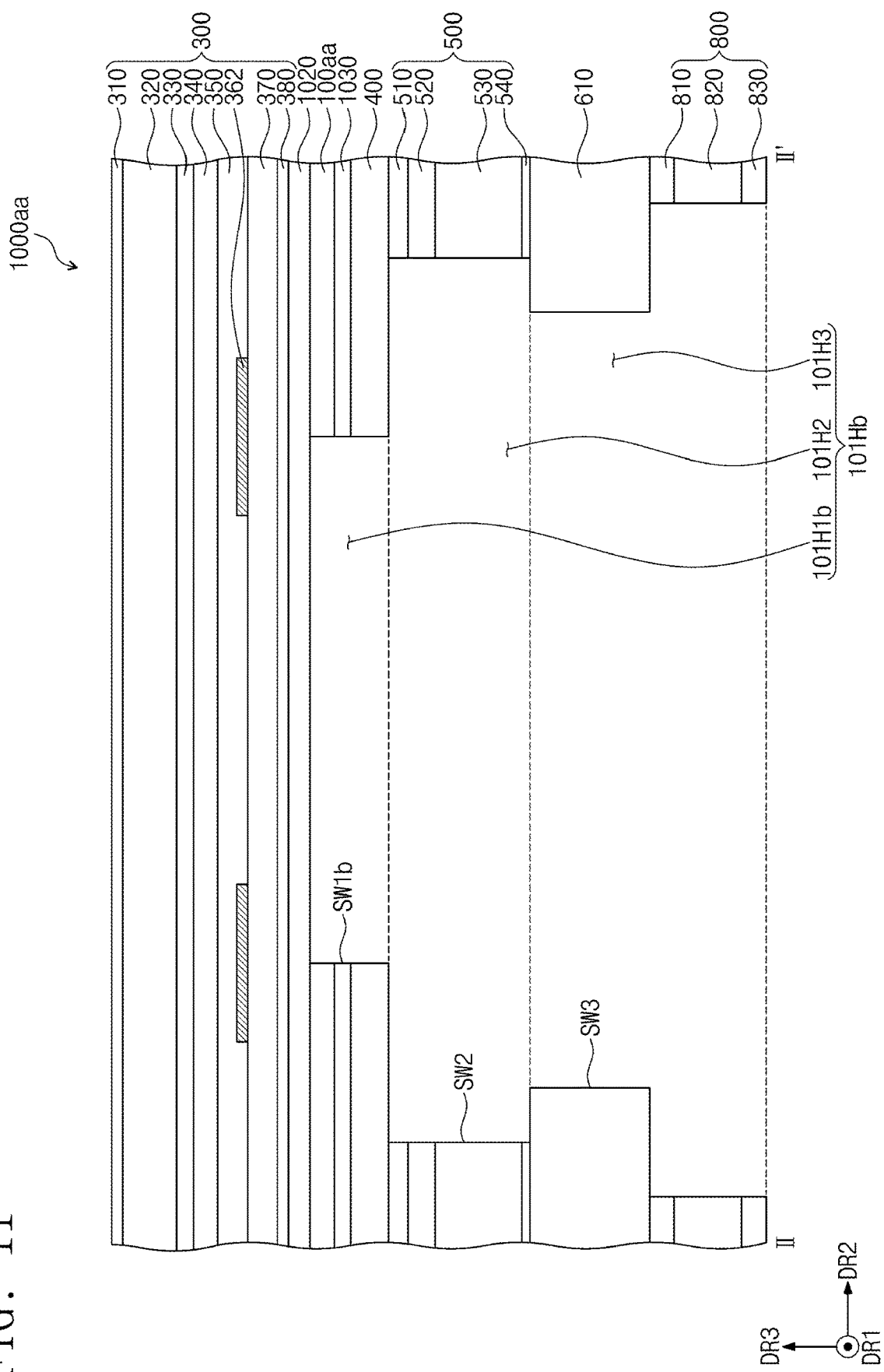
FIG. 11 is a cross-sectional view taken along sectional line II-IF of FIG. 1A according to an example embodiment.
Figure 12:
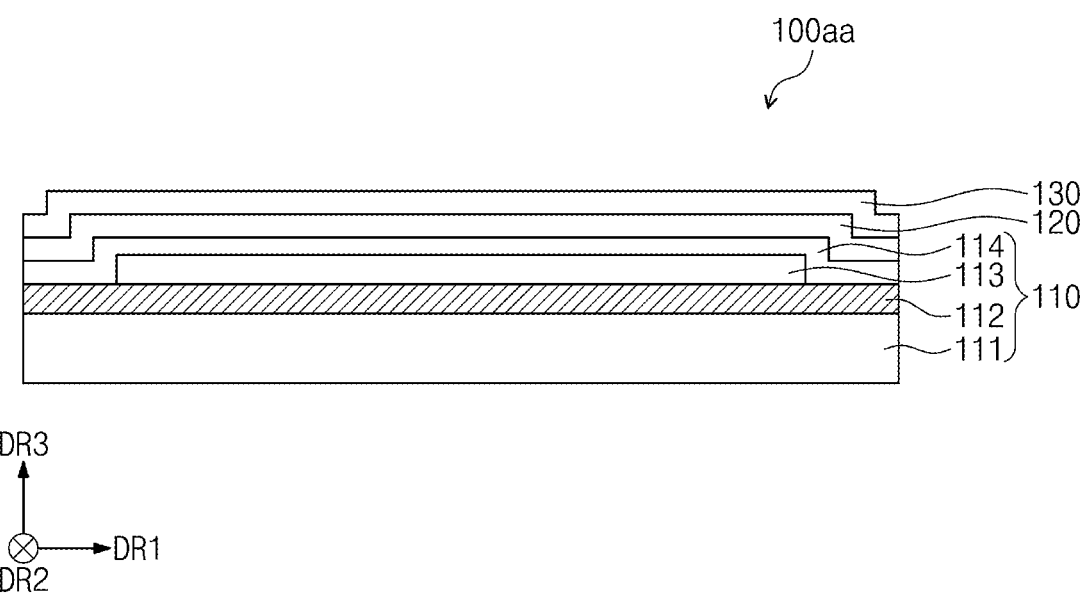
FIG. 12 is a cross-sectional view showing a display panel according to an example embodiment.

FIG. 11 is a cross-sectional view taken along sectional line II-IF of FIG. 1A according to an example embodiment. FIG. 12 is a cross-sectional view showing a display panel according to an example embodiment. In FIG. 11, the same reference numerals denote the same elements in FIG. 6, and thus, detailed descriptions of the same elements will be omitted.

Referring to FIGS. 11 and 12, the anti-reflective member 200 and the first adhesive layer 1010 may be omitted from an electronic device 1000aa when compared with the electronic device 1000 described with reference to FIG. 6. An anti-reflective layer 130 that serves as the anti-reflective member 200 (refer to FIG. 6) may be included in a display panel 100aa.

The display panel 100aa may include a display layer 110, a sensor layer 120, and the anti-reflective layer 130.

The anti-reflective layer 130 according to some example embodiments may include color filters. The color filters may be arranged in a predetermined arrangement. The arrangement of the color filters may be determined by taking into account emission colors of pixels included in the display layer 110. In addition, the anti-reflective layer 130 may further include a black matrix adjacent to the color filters.

The anti-reflective layer 130 according to some example embodiments may include a destructive interference structure. For instance, the destructive interference structure may include a first reflective layer and a second reflective layer disposed on a layer different from a layer on which the first reflective layer is disposed. A first reflective light and a second reflective light, which are respectively reflected from the first reflective layer and the second reflective layer, may destructively interfere with each other, and thus, the reflectance of the external light may be reduced.

A first hole 101Hb into which a camera module 2100 is inserted may include a first hole portion 101H1b, a second hole portion 101H2, and a third hole portion 101H3. The first hole portion 101H1b may be defined by a first sidewall SW1b. The first hole portion 101H1b may be formed by a laser cutting process. For example, a lower protective film 400, a third adhesive layer 1030, and the display panel 100aa may be cut to form the first hole portion 101H1b.

Although certain example embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. An electronic device comprising:
   a window;
   a display panel disposed under the window;
   lower functional layers disposed under the display panel; and
   a first electronic module disposed under the window and inserted into a first hole defined in the display panel and the lower functional layers,
   wherein the first hole comprises:
      a first hole portion defined in the display panel; and
      a second hole portion defined in at least one of the lower functional layers, the second hole portion having a width greater than a width of the first hole portion,
   wherein a distance between the window and the first electronic module is greater than or equal to multiplying a sum of thicknesses of at least one of the lower functional layers and a maximum compression rate of the at least one of the lower functional layers, and
   wherein the at least one of the lower functional layers has an elastic modulus less than or equal to a predetermined value.

2. The electronic device of claim 1, further comprising:
   a second electronic module inserted into a second hole defined in the one of the lower functional layers,
   wherein the first hole has a depth greater than a depth of the second hole.

3. The electronic device of claim 2, wherein a portion of the display panel, which overlaps the second hole, is configured to display an image.

4. The electronic device of claim 1, further comprising:
an impact absorbing layer disposed between the window and the display panel; and
a hard coating layer disposed between the impact absorbing layer and the display panel,
wherein a portion of the hard coating layer is exposed through the first hole.

5. The electronic device of claim 4, wherein the impact absorbing layer is a stretch film having a controlled optical axis.

6. The electronic device of claim 1, wherein the distance between the window and the first electronic module is greater than or equal to about 60% of the sum of thicknesses of the at least one of the lower functional layers.

7. The electronic device of claim 1, wherein the predetermined value is greater than 0 MPa and less than or equal to about 50 MPa.

8. The electronic device of claim 1, wherein at least one layer is disposed between the window and the first hole.

9. The electronic device of claim 1, further comprising:
an adhesive layer disposed between the window and the display panel, the adhesive layer being attached to the window,
wherein the adhesive layer has an area smaller than an area of the window.

10. The electronic device of claim 1, further comprising:
a protective layer disposed on the window,
wherein a sidewall of the protective layer protrudes outward more than a sidewall of the window.

11. The electronic device of claim 1, further comprising:
a light blocking pattern disposed between the window and the display panel,
wherein, when viewed in a plane, the light blocking pattern overlaps a sidewall of the display panel, which defines the first hole portion.

12. The electronic device of claim 11, wherein, when viewed in the plane, the light blocking pattern is surrounded by a sidewall of the one of the lower functional layers, which defines the second hole portion.

13. The electronic device of claim 12, wherein the sidewall of the one of the lower functional layers, which defines the second hole portion, does not overlap the light blocking pattern.

14. The electronic device of claim 1,
wherein the lower functional layers comprise:
a plate disposed under the one of the lower functional layers,
wherein the plate comprises a third hole portion defined therein, the third hole portion having a width greater than the width of the first hole portion and smaller than the width of the second hole portion, and
wherein the first hole portion, the second hole portion, and the third hole portion overlap each other to form the first hole.

15. The electronic device of claim 1, wherein an upper surface of the first electronic module is disposed in the second hole portion.

16. The electronic device of claim 1, wherein the window, the display panel, and the lower functional layers are configured to fold and unfold about a folding axis, which extends in a predetermined direction.

17. An electronic device comprising:
a window;
a display panel disposed under the window;
lower functional layers disposed under the display panel;
an electronic module disposed under the window and inserted into a hole defined in the display panel and the lower functional layers,
wherein a distance between the window and the electronic module is greater than or equal to about 60% of a sum of thicknesses of at least one of the lower functional layers, and
wherein the at least one of the lower functional layers has an elastic modulus less than or equal to 50 MPa.

* * * * *

UNITED STATES PATENT AND TRADEMARK OFFICE
CERTIFICATE OF CORRECTION

| | |
|---|---|
| PATENT NO. | : 11,659,653 B2 |
| APPLICATION NO. | : 17/070491 |
| DATED | : May 23, 2023 |
| INVENTOR(S) | : Jaiku Shin et al. |

It is certified that error appears in the above-identified patent and that said Letters Patent is hereby corrected as shown below:

On the Title Page

Item [72], The Fourth Inventors Name:
Delete "Chui" and insert --Chul--

Signed and Sealed this
Second Day of July, 2024

Katherine Kelly Vidal
Director of the United States Patent and Trademark Office